United States Patent
Huang

(10) Patent No.: US 11,769,536 B2
(45) Date of Patent: Sep. 26, 2023

(54) SIGNAL GENERATING CIRCUIT AND METHOD, AND SEMICONDUCTOR MEMORY

(71) Applicant: CHANGXIN MEMORY TECHNOLOGIES, INC., Hefei (CN)

(72) Inventor: Zequn Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 37 days.

(21) Appl. No.: 17/651,475

(22) Filed: Feb. 17, 2022

(65) Prior Publication Data

US 2023/0005516 A1 Jan. 5, 2023

Related U.S. Application Data

(63) Continuation of application No. PCT/CN2021/112810, filed on Aug. 16, 2021.

(30) Foreign Application Priority Data

Jul. 2, 2021 (CN) .......................... 202110750417.X

(51) Int. Cl.
*G11C 7/22* (2006.01)
*G11C 7/10* (2006.01)
(Continued)

(52) U.S. Cl.
CPC .............. *G11C 7/222* (2013.01); *G11C 7/109* (2013.01); *G11C 7/1063* (2013.01); *G06F 11/1076* (2013.01); *H03K 5/151* (2013.01)

(58) Field of Classification Search
CPC .................................. G11C 7/222; G11C 7/22
(Continued)

(56) References Cited

U.S. PATENT DOCUMENTS 5,712,595 A 1/1998 Yokoyama
5,844,859 A 12/1998 Iwamoto
(Continued)

FOREIGN PATENT DOCUMENTS

CN 1194440 A 9/1998
CN 201690355 U 12/2010
(Continued)

OTHER PUBLICATIONS

International Search Report in the international application No. PCT/CN2021/112810, dated Mar. 31, 2022.
(Continued)

*Primary Examiner* — Muna A Techane
(74) *Attorney, Agent, or Firm* — SYNCODA LLC; Feng Ma

(57) ABSTRACT

A signal generating circuit includes the following: a clock circuit, configured to receive an external clock signal to generate an internal clock signal; a controlling circuit, configured to generate a control signal according to the frequency of the external clock signal; and a generating circuit, connected with the clock circuit and the controlling circuit respectively, and configured to receive the internal clock signal, the control signal and a flag signal to generate a target signal. When the flag signal changes from a first level to a second level, the target signal is changed from a third level to a fourth level, and after the target signal maintains the fourth level for a target time length, the target signal is changed from the fourth level to the third level. The generating circuit is further configured to determine the target time length according to the internal clock signal and the control signal.

20 Claims, 8 Drawing Sheets

(51) Int. Cl.
*G06F 11/10* (2006.01)
*H03K 5/151* (2006.01)

(58) Field of Classification Search
USPC .................................................. 365/233.1
See application file for complete search history.

(56) References Cited

U.S. PATENT DOCUMENTS

| | | | |
|---|---|---|---|
| 5,903,513 A | 5/1999 | Itou | |
| 6,111,807 A | 8/2000 | Ooishi | |
| 7,627,839 B1* | 12/2009 | Chan | H03K 3/0315 |
| | | | 716/108 |
| 10,068,626 B2* | 9/2018 | Eaton | G11C 7/22 |
| 2001/0021142 A1 | 9/2001 | Ooishi | |
| 2013/0015893 A1 | 1/2013 | Severson | |
| 2019/0347157 A1 | 11/2019 | Waldrop et al. | |
| 2020/0372958 A1* | 11/2020 | Kasai | G11C 16/26 |
| 2021/0117349 A1 | 4/2021 | Kim et al. | |

FOREIGN PATENT DOCUMENTS

| | | |
|---|---|---|
| CN | 111986722 A | 11/2020 |
| CN | 112669888 A | 4/2021 |
| GB | 2298726 A | 9/1996 |
| WO | 2013009918 A1 | 1/2013 |

OTHER PUBLICATIONS

Supplementary European Search Report in the European application No. 21867917.3, dated Dec. 21, 2022.

* cited by examiner

| tCCDL | Data transmission rate | External clock signal frequency | External clock signal period |
|---|---|---|---|
| 4 | Data rate <1333Mbps | 666.5MHz | 1.5ns |
| 5 | 1333Mbps <Data rate < 1866Mbps | 800/933MHz | 1.07/1.25ns |
| 6 | 1866Mbps < Data rate < 2400Mbps | 1066.5/1200MHz | 0.83/0.93ns |
| 7 | 2400Mbps <Data rate < 2666Mbps | 1333MHz | 0.75ns |
| 8 | 2666Mbps < Data rate < 3200Mbps | 1466.5/1600MHz | 0.625/0.68ns |

FIG. 4

SIGNAL GENERATING CIRCUIT AND METHOD, AND SEMICONDUCTOR MEMORY

CROSS-REFERENCE TO RELATED APPLICATIONS

This application is a continuation of International Patent Application No. PCT/CN/2021/112810 filed on Aug. 16, 2021, which claims priority to Chinese Patent Application No. 202110750417.X filed on Jul. 2, 2021. The disclosures of these applications are hereby incorporated by reference in their entirety.

BACKGROUND

A semiconductor memory may include a volatile memory (such as a dynamic random access memory or a static random access memory) and a non-volatile memory (such as a flash memory, a phase change memory, a ferroelectric memory, a magnetic memory, or a resistive memory). Generally, the volatile memory supports high-speed random access, and is often used as a main memory of a computing system (such as a personal computer, a server, or a workstation).

In the manufacturing process of semiconductor memories, due to the difference of positions on the same wafer, or the difference in parameters of field effect transistors thereof between different batches of wafers, the manufactured semiconductor memories have different process corners. Therefore, a clock signal generated by a ring oscillator in the semiconductor memory may change with the process variation, and a signal controlled by the clock signal may also change with the process variation, so that the signals controlled by the clock signal in different semiconductor memories may have a certain error with respect to an expected value, or even exceed a standard requirement.

SUMMARY

The present application relates, but is not limited, to a signal generating circuit and method, and a semiconductor memory.

In a first aspect, embodiments of the present application provide a signal generating circuit, and the circuit includes a clock circuit, a controlling circuit and a generating circuit. The clock circuit is configured to receive an external clock signal to generate an internal clock signal. The controlling circuit is configured to generate a control signal according to a frequency of the external clock signal. The generating circuit is connected with the clock circuit and the controlling circuit respectively, and configured to receive the internal clock signal, the control signal and a flag signal to generate a target signal. When the flag signal changes from a first level to a second level, the target signal is changed from a third level to a fourth level, and after the target signal maintains the fourth level for a target time length, the target signal is changed from the fourth level to the third level. The generating circuit is further configured to determine the target time length according to the internal clock signal and the control signal.

In a second aspect, the embodiments of the present application provide a signal generating method, and the method includes the following operations. An external clock signal is received by a clock circuit to generate an internal clock signal, and the internal clock signal is output to a generating circuit. A control signal is generated according to the frequency of the external clock signal by a controlling circuit, and the control signal is output to the generating circuit. The internal clock signal, the control signal and a flag signal are received by the generating circuit to generate a target signal; when the flag signal changes from a first level to a second level, the target signal is controlled to change from a third level to a fourth level, and after the target signal maintains the fourth level for a target time length, the target signal is controlled to change from the fourth level to the third level; where the target time length is determined by the generating circuit according to the internal clock signal and the control signal.

In a third aspect, the embodiments of the present application provide a semiconductor memory, and the semiconductor memory includes the signal generating circuit according to any one of the first aspect.

BRIEF DESCRIPTION OF THE DRAWINGS

In the drawings, unless otherwise specified, the same reference numerals refer to the same or similar parts or elements throughout a plurality of drawings. These drawings are not necessarily drawn to scale. It should be understood that these drawings only describe some embodiments disclosed according to the present application, and should not be regarded as limiting the scope of the present application.

FIG. 4 is a parameter table of tCCDL provided by embodiments of the present application.

DETAILED DESCRIPTION

Figure 1:
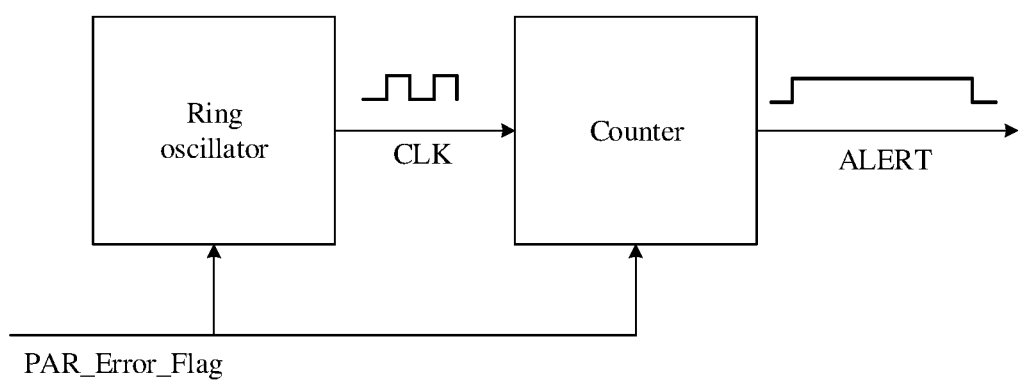
FIG. 1 is a parity check alert circuit of a common Double-Data-Rate Fourth Generation Synchronous Dynamic Random Access Memory (DDR4) chip.

Exemplary embodiments of the present application will be described below with reference to the accompanying drawings. Although the drawings show the exemplary embodiments of the present application, it should be understood that the present application can be implemented in various forms and shall not be limited by embodiments described herein. On the contrary, these embodiments are provided so that this application will be thoroughly understood, and will fully convey the scope of this application to those skilled in the art.

A number of specific details are given below to provide a more thorough understanding of this application. However, it is apparent to those skilled in the art that this application can be implemented without one or more of these details. In other examples, to avoid confusion with this application, some technical features known in the art are not described;

namely, all the features of the actual embodiments are not described here, nor are known functions and structures described in detail.

In addition, the drawings are only schematic diagrams of this application and are not necessarily drawn to scale. The same reference numbers in the drawing indicate the same or similar part, and thus their description will be omitted. Some of the block diagrams shown in the drawings are functional entities, and do not necessarily correspond to physically or logically separate entities. These functional entities may be implemented in software form, or in one or more hardware modules or integrated circuits, or in different network and/or processor devices and/or microcontroller devices.

The flowchart shown in the drawings is exemplary description only and does not necessarily include all the steps. For example, some steps may also be decomposed, while others may be merged or partially merged, so the order of actual execution may be changed according to the actual situation.

The terms used herein are for the purpose of describing specific embodiments only and not intended to limit the disclosure. As used herein, singular forms "a/an", "one", and "said/the" are also intended to include the plural forms, unless otherwise specified in the context. It is also to be understood that, when terms "composed of" and/or "including" are used in this specification, the presence of the features, integers, steps, operations, elements, and/or components is determined, but the presence or addition of one or more other features, integers, steps, operations, elements, components, and/or groups is also possible. As used herein, term "and/or" includes any and all combinations of the related listed items.

In the Specification (SPEC) of a DDR4 chip, the pulse width tPAR_ALERT_PW of an ALERT signal output by a command/address parity alert system (C/A Parity Alert) is specified to be between 60 ns and 120 ns. FIG. 1 is a parity check alert circuit of a common DDR4 chip. In this circuit design, after an error occurs in the parity check, a PAR_Error_Flag signal may be output to enable a ring oscillator, so that the ring oscillator generates a clock signal CLK having a fixed period of T'. Then, according to the SPEC requirements of the tPAR_ALERT_PW, the number of stages N' of a counter is determined. Through such circuit design, the parity check alert circuit outputs logic 1 while the PAR_Error_Flag signal is received, and then outputs logic 0 after the counting of the counter ends. The final result is the pulse width of the output ALERT signal tPAR_ALERT_PW=T'× N', where T' is the period of the clock signal generated by the ring oscillator, and N' is the number of stages of the counter.

Figure 2:
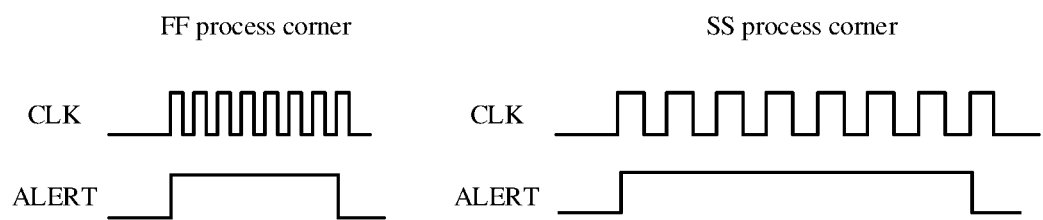
FIG. 2 is pulse width deviations of an ALERT signal under different processes.

However, although the pulse width of the ALERT signal output by this circuit design does not change with changes of the operating frequency of the chip, it may change with the change of a process. During manufacturing of semiconductor devices, due to the difference of their positions on the same wafer, or the difference in parameters of field effect transistors thereof between different batches of wafers, different deviations in process may be generated. The process is generally divided into three processes including Slow-Slow (SS) process, Typical-Typical (TT) process, and Fast-Fast (PB) process. FIG. 2 is pulse width deviations of an ALERT signal under different processes. As shown in FIG. 2, under the case of a particularly large process variation, the period T' of the clock signal CLK generated by the ring oscillator may be very different. For example, in the FF process, the period T' of the clock signal CLK generated by the ring oscillator is relatively small, but in the SS process, the period T' of the clock signal CLK generated by the ring oscillator is relatively large. As a result, under the magnification of the number of stages N of the counter, the pulse width tPAR_ALERT_PW of the ALERT signal under the SS process easily exceeds the 60 ns-120 ns interval specified by the SPEC, and the pulse width tPAR_ALERT_PW of the ALERT signal under the FF process is also easily smaller than the 60 ns-120 ns interval specified by the SPEC.

For this purpose, the following technical schemes of the embodiments of the present application are proposed.

Figure 3:
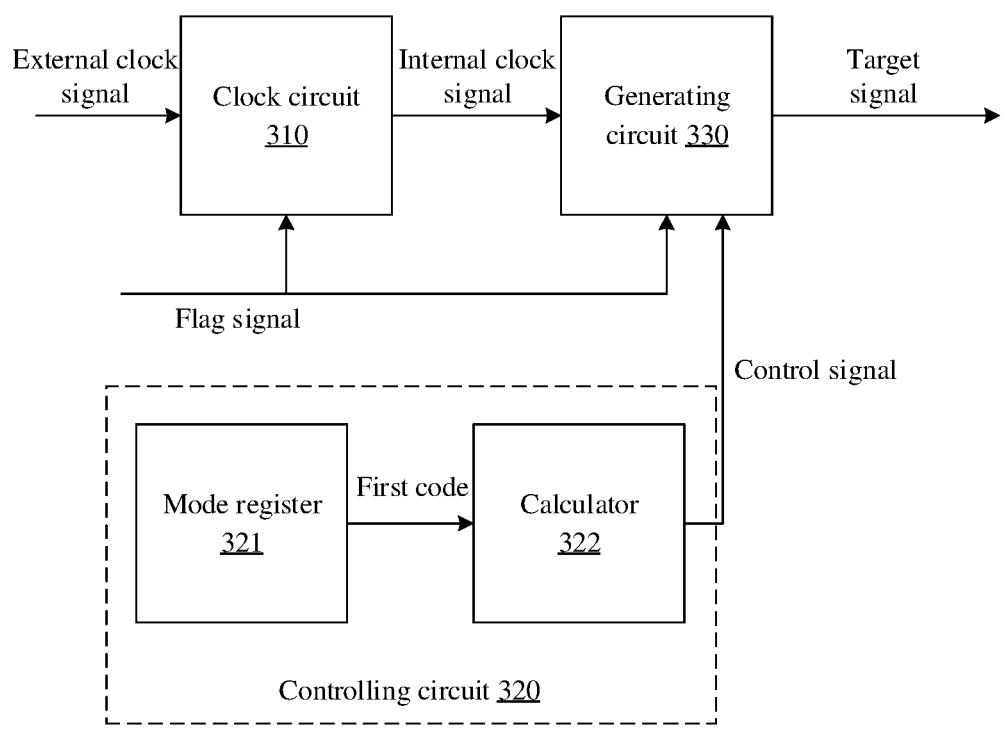
FIG. 3 is a schematic structure diagram of a signal generating circuit provided by an embodiment of the present application.

Embodiments of the present application provide a signal generating circuit. FIG. 3 is a structure schematic diagram of a signal generating circuit provided by an embodiment of the present application. As shown in FIG. 3, the signal generating circuit includes a clock circuit 310, a controlling circuit 320 and a generating circuit 330.

The clock circuit 310 is configured to receive an external clock signal to generate an internal clock signal.

The controlling circuit 320 is configured to generate a control signal according to a frequency of the external clock signal.

The generating circuit 330 is connected with the clock circuit 310 and the controlling circuit 320 respectively, and configured to receive the internal clock signal, the control signal and a flag signal to generate a target signal. When the flag signal changes from a first level to a second level, the target signal is changed from a third level to a fourth level, and after the target signal maintains the fourth level for a target time length, the target signal is changed from the fourth level to the third level. The generating circuit 330 is further configured to determine the target time length according to the internal clock signal and the control signal.

Here, the target time length during which the target signal output by the generating circuit 330 is maintained at the fourth level is the pulse width of the target signal output by the generating circuit 330.

According to the embodiment of the present application, the clock circuit 310 generates the internal clock signal through external clock information, so that the internal clock signal of the signal generating circuit is not affected by the process. Based on this, the pulse width of the target signal output by the signal generating circuit provided in the embodiment of the present application is not affected by the process.

In the embodiment of the present application, the control signal is generated according to the frequency of the external clock signal, and thus the control signal is a signal related to the frequency of the external clock signal. Therefore, when the frequency of the external clock signal (the frequency of the internal clock signal) changes, the control signal may also change accordingly, and thus the pulse width of the target signal may be adjusted through the internal clock signal and the control signal.

Further, in the embodiment of the present application, the pulse width of the target signal is adjusted through the internal clock signal and the control signal, so that the pulse width of the target signal is controlled within a certain range, and thus the change of the pulse width of the target signal with the frequency is weakened or eliminated, thereby enabling the pulse width of the target signal to be stable.

Embodiments of the present application provide a signal generating circuit, and the signal generating circuit is configured to generate a target signal and adjust the pulse width of the target signal, so that the target signal is stabilized within a certain range. The signal generating circuit may be widely used in semiconductor memories, such as Double Data Rate 2 (DDR2), DDR3, DDR4, Low Power Double Data Rate 2 (LPDDR2), and LPDDR3, which are listed in detail herein.

In some embodiments of the present application, the frequency of the external clock signal does not change with variations in temperature and process. Therefore, the pulse width of the target signal in the embodiment of the present application is not affected by the temperature and process.

In some embodiments of the present application, the flag signal is a check flag signal, and the check flag signal is used to represent a parity check error or a redundancy check error.

In some embodiments of the present application, the clock circuit 310 is specifically configured to shield the external clock signal based on the flag signal to generate the internal clock signal.

In some embodiments of the present application, the clock circuit 310 includes logic AND gate(s); the logical AND gate is configured to receive the flag signal and the external clock signal to generate the internal clock signal. Specifically, the logic AND gate shields the external clock signal when a check error does not occur based on the flag signal, to generate the internal clock signal. Namely, the internal clock signal is an external clock signal when the check error occurs. Therefore, the power consumption of the generating circuit when it does not need to generate the target signal is reduced. Specifically, when the parity check error does not occur, the logic AND gate may shield the external clock signal, so that no internal clock signal is input to the generating circuit, and thus the power consumption of the generating circuit when it does not need to generate the parity check alert signal may be reduced. In the present application, the frequency of the internal clock signal is the same as the frequency of the external clock signal.

In some embodiments of the present application, the controlling circuit 320 includes a mode register 321 and a calculator 322. The mode register 321 is configured to store a delay (tCCD) between adjacent column address strobe signals, and output a first code to represent the delay tCCD between adjacent column address strobe signals. The calculator 322 is configured to receive the first code, multiply the first code by a coefficient to output as the control signal. In some embodiments of the present application, the control signal is obtained by multiplying the first code by the coefficient. Here, the first code is a code that represents the delay tCCD between the adjacent column address strobe signals. In a specific example, the mode register 321 is a Mode Register 6 (MR6) in DDR4.

CCD is short for CAS to CAS Command Delay, and tCCD is a delay time from Column Access Strobe (CAS) to CAS, which is used to trigger an access operation. The access operation may be, for example, writing or reading operation. In some examples, the delay tCCD from CAS to CAS may be determined before a semiconductor device is manufactured, and may be equal to (BL/2), where BL is a burst length. A single clock period T may be used as a unit for indicating the number of clock periods in the clock signal. In other words, 1T may indicate one clock period of the clock signal. A DDR device usually uses a two-period command, for example, a read command is followed by a CAS command to trigger access. Therefore, tCCD is usually understood as timing between successive access commands Additional bank group (a group of independently or separately addressable memory banks) is achieved in DDR4 so as to improve the performance with respect to tCCD. By using the separate memory bank groups, the access may be performed across the different memory bank groups. Therefore, DDR4 achieves tCCDS and tCCDL timing (where "S" is short, and "L" is long). tCCDL is used to access the same memory bank group; and tCCDS is used to access different memory bank groups. tCCDL is greater than or equal to tCCDS. Herein, tCCDL changes according to the frequency of the external clock signal, and tCCDS does not change. In this case, tCCDL and tCCDS may be set differently according to the value of the mode register.

In some embodiments, under the condition that the signal generating circuit is applied to the DDR4 chip, the mode register 321 is configured to store delay tCCDL between adjacent column address strobe signals, and output a first code L to represent the delay tCCDL between the adjacent column address strobe signals. The calculator 322 is configured to receive the first code L, and multiply the first code L by a coefficient to output as the control signal. In some embodiments of the present application, the control signal is obtained by multiplying the first code by the coefficient. Here, the first code L is a code that represents the delay tCCDL between the adjacent column address strobe signals.

FIG. 4 is a corresponding relationship among parameters of tCCDL and the data transmission rates applicable to DDR4, frequencies of the external clock signal, and periods of the external clock signal provided by the embodiment of the present application. Because the setting of tCCDL is increased according to increasing of the frequency of the external clock signal, and the change trend thereof with the frequency of the internal clock signal is opposite to the change trend of the period of the internal clock signal with the frequency of the internal clock signal, so that the control signal generated on the basis of tCCDL may effectively compensate the change of the pulse width of the target signal with the frequency of the internal clock signal.

Here, the coefficient N is an amplification coefficient of the first code L. In practical applications, the corresponding coefficient N may be selected according to the actual pulse width of the target signal. Here, the number of stages of the counter is a target value N×L represented by the control signal. In the embodiments of the present application, the target value represented by the control signal increases with increasing of the frequency of the external clock signal.

Here, the control signal is a Counter Stage Selection signal of the counter, and the counter may determine its stage number according to the control signal, so as to count based on the stage number.

In some embodiments of the present application, the generating circuit 330 includes a counter. When the flag signal changes from the first level to the second level, the counter starts to count the internal clock signal, and after the count value reaches the target value represented by the control signal, the target signal is controlled to change from the fourth level to the third level. When the flag signal is used to represent the parity check error, after the parity check error occurs, the flag signal PAR_Error_Flag is output, and the flag signal PAR_Error_Flag is valid at high level, so that when the flag signal PAR_Error_Flag changes from the low level to the high level, the generating circuit controls the target signal to change from the low level to the high level, and at the same time, the counter starts to count the internal clock signal, and after the count value reaches the target value represented by the control signal, the generating circuit controls the target signal to change from the high level to the low level.

In some embodiments, the flag signal is used to represent the parity check error. After an error occurs in the parity check, the check flag signal PAR_Error_Flag is output. Then, the target signal generated by the generating circuit is a parity check alert signal ALERT. Therefore, the pulse width tPAR_ALERT_PW of the parity check alert signal may be adjusted by the signal generating circuit provided in the embodiments of the present application, so that the pulse width tPAR_ALERT_PW of the parity check alert signal is controlled within a certain range, and thus the change of the pulse width tPAR_ALERT_PW of the parity check alert signal with the frequency is weakened or eliminated, thereby enabling the pulse width tPAR_ALERT_PW of the parity check alert signal to be stabilized within the interval specified by the SPEC. It should be noted that the ALERT signal is not a signal that is finally output through an alert_n pin, and the ALERT signal needs to pass through a plurality of inverters or output buffer circuits before it is output to the alert_n pin of the chip. In a specific example, the ALERT signal may be output to the alert_n pin of the chip after passing through an odd number of inverters, so as to guarantee that the alert_n signal output by the alert_n pin is valid at low level.

Figure 5A:
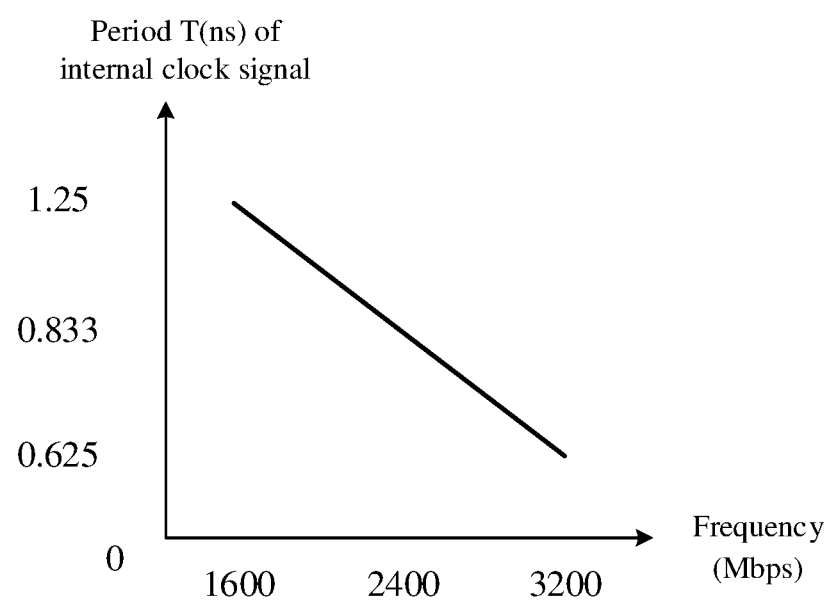
FIG. 5A is a change trend diagram of a period of an internal clock signal varying with the frequency according to an embodiment of the present application.
Figure 5B:
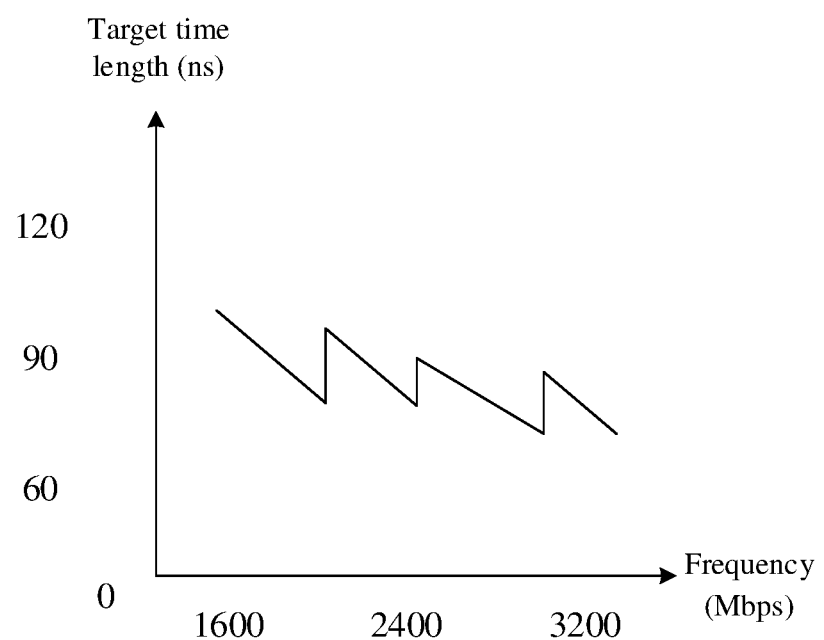
FIG. 5B is a change trend diagram of a target time length varying with the frequency provided by an embodiment of the present application.

Here, the stage number of the counter is the target value N×L represented by the control signal. If the period of the internal clock signal is T, the target time length (i.e., the pulse width of the target signal) is T×N×L. Herein, L and T have opposite change trends with changes of the frequency of the internal clock signal. Therefore, the target time length (i.e., the pulse width of the target signal) hardly changes with the change of the internal clock signal frequency, and in other words, the target time length (the pulse width of the target signal) remains stable under different frequencies of the internal clock signal. FIG. 5A is a change trend diagram of a period of an internal clock signal varying with the frequency according to an embodiment of the present application, and FIG. 5B is a change trend diagram of a target time length varying with the frequency provided by an embodiment of the present application. In FIG. 5A, the ordinate is the period of the internal clock signal, and the abscissa is the frequency of the internal clock signal; and in FIG. 5B, the ordinate is the target time length, and the abscissa is the frequency of the internal clock signal. As shown in FIG. 4, FIG. 5A and FIG. 5B, the period T of the internal clock signal decreases with the increase of the frequency of the internal clock signal, representing that the first code L of the delay tCCDL between adjacent column address strobe signals increases with the increase of the frequency of the internal clock signal, so that the target value N×L represented by the control signal also increases with the increase of the frequency of the internal clock signal, and thus the target time length obtained on the basis of the period T of the internal clock signal and the target value N×L represented by the control signal may also be stabilized within the interval specified by the SPEC in the case that the internal clock signal frequency changes.

Figure 6:
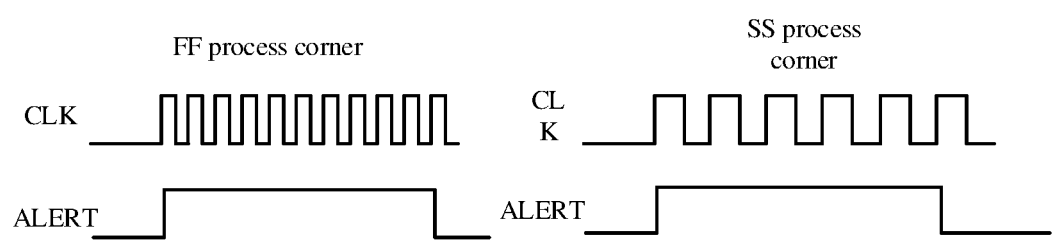
FIG. 6 is a schematic diagram of pulse widths of an ALERT signal under different processes.

FIG. 6 is a schematic diagram of pulse widths of an ALERT signal under different processes. The ALERT signal in FIG. 6 is generated on the basis of the signal generating circuit provided by the embodiment of the present application. As shown in FIG. 6, under the FF process corner, the period T of the clock signal CLK generated by a ring oscillator is small, but the target value N×L (the number of stages of the counter) represented by the control signal is large; under the SS process corner, the period T of the clock signal CLK generated by the ring oscillator is large, but the target value N×L (the number of stages of the counter) represented by the control signal is small. Therefore, the pulse width of the ALERT signal output under the FF process corner and the SS process corner has little changes. That is, under the control of both the internal clock signal and the control signal, the pulse width of the target signal may be controlled within a certain range, and thus the change of the pulse width of the target signal with the frequency of the internal clock signal is weakened or eliminated, so that the pulse width of the target signal is stabilized within the interval specified by SPEC. In some embodiments of the present application, the first level is a low level, the second level is a high level, the third level is a low level, and the fourth level is a high level. Thus, when the flag signal changes from the low level to the high level, the target signal is changed from the low level to the high level, and the target signal changes from the high level to the low level after maintaining the high level for the target time length. Here, the flag signal is a check flag signal, and the check flag signal is valid at high level. When the check flag signal is at the high level, it represents that a check error occurs; and when the check flag signal is at the low level, it represents that no check error occur. In some embodiments of the present application, the target time length is determined according to the period of the internal clock signal and the target value represented by the control signal, and the period of the internal clock signal and the target value represented by the control signal have opposite change trends with respect to the frequency of the internal clock signal, and thus the target time length (the pulse width of the target signal) hardly changes with the change of the frequency of the internal clock signal. In other words, the target time length (i.e., the pulse width of the target signal) remains stable under the different frequencies of the internal clock signal.

Figure 7:
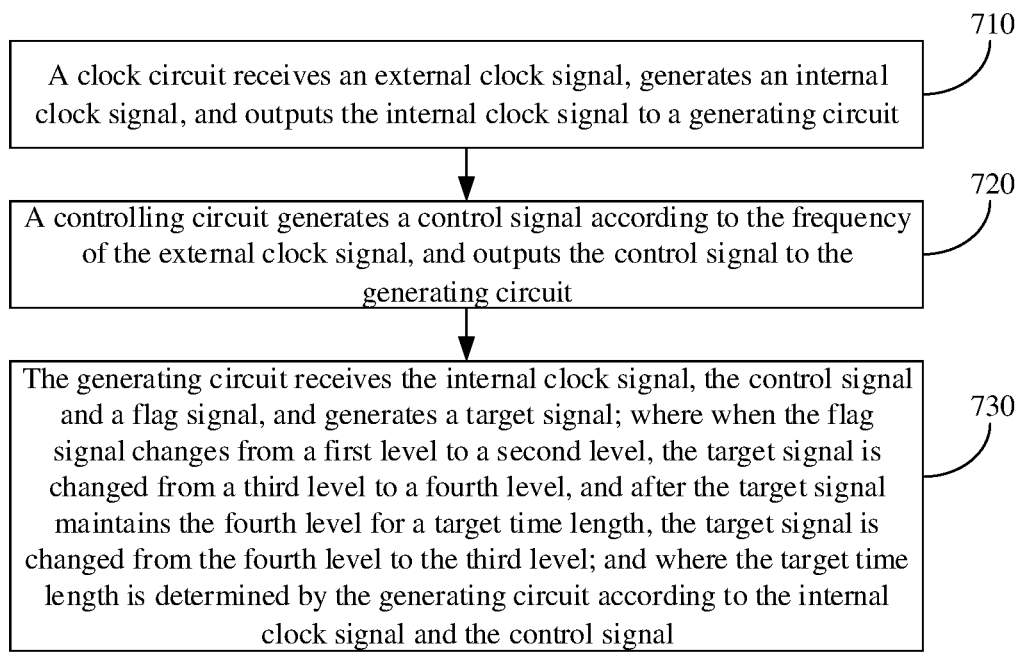
FIG. 7 is a schematic flowchart of implementation of a signal generating method provided by an embodiment of the present application.

Based on the same technical idea as the aforementioned signal generating circuit, embodiments of the present application provide a signal generating method. FIG. 7 is a schematic flowchart of implementation of a signal generating method provided by an embodiment of the present application. As shown in FIG. 7, the method mainly includes the following steps.

At S710, an external clock signal is received by a clock circuit to generate an internal clock signal, and the internal clock signal is output by the clock circuit to a generating circuit.

S720, a control signal is generated by a controlling circuit according to the frequency of the external clock signal, and the control signal is output to the generating circuit by the controlling circuit.

S730, the generating circuit receives the internal clock signal, the control signal and a flag signal to generate a target signal. When the flag signal changes from a first level to a second level, the target signal is changed from a third level to a fourth level, and after the target signal maintains the fourth level for a target time length, the target signal is changed from the fourth level to the third level. The target time length is determined by the generating circuit according to the internal clock signal and the control signal.

Here, the target time length during which the target signal output by the generating circuit is maintained at the fourth level is the pulse width of the target signal output by the generating circuit.

In the embodiment of the present application, the clock circuit receives external clock information and generates the internal clock signal, so that the internal clock signal of the signal generating circuit is not affected by the process. Based on this, the pulse width of the target signal output by the signal generating circuit provided in the embodiments of the present application is not affected by the process.

In the embodiment of the present application, the control signal is generated according to the frequency of the external clock signal, so that the control signal is a signal related to the frequency of the external clock signal. Therefore, the frequency of the external clock signal (the frequency of the internal clock signal) changes, the control signal may also change accordingly, and thus the pulse width of the target signal may be controlled through the internal clock signal and the control signal.

Further, in the embodiment of the present application, the pulse width of the target signal is adjusted through the internal clock signal and the control signal, so that the pulse width of the target signal is controlled within a certain range, and thus the change of the pulse width of the target signal with the frequency is weakened or eliminated, thereby enabling the pulse width of the target signal to be stable.

In the embodiment of the present application, the frequency of the external clock signal does not change with the changes in temperature and process. Therefore, the pulse width of the target signal in the embodiment of the present application is not affected by the temperature and process.

In some embodiments of the present application, S710 includes the following operation. The external clock signal is shielded based on the flag signal by the clock circuit to generate the internal clock signal.

In some embodiments of the present application, S710 includes the following operations. A logic AND gate is used to receive the flag signal and the external clock signal to generate the internal clock signal. Specifically, the logic AND gate shields the external clock signal when a check error does not occur based on the flag signal to generate the internal clock signal. Namely, the internal clock signal is an external clock signal when the check error occurs. Therefore, the power consumption of the generating circuit when it does not need to generate the target signal is reduced. Specifically, when a parity check error does not occur, the logic AND gate may shield the external clock signal, so that the internal clock signal may not be input to the generating circuit, and thus the power consumption of the generating circuit when it does not need to generate a parity check alert signal may be reduced. In the present application, the frequency of the internal clock signal is the same as the frequency of the external clock signal.

In some embodiments of the present application, the flag signal is a check flag signal, and the check flag signal is used to represent a parity check error or a redundancy check error.

In some embodiments of the present application, S720 includes the following operations. A first code is output by a mode register to represent delay tCCD between adjacent column address strobe signals; the mode register stores the delay tCCD between the adjacent column address strobe signals; and a calculator receives the first code, and multiplies the first code by a coefficient to outputs as the control signal.

In some embodiments, in the case that the signal generating method is applied to a DDR4 chip, S720 includes the following operations. The first code L is output by the mode register to represent the delay tCCDL between the adjacent column address strobe signals; the calculator receives the first code L, and multiplies the first code L by the coefficient to outputs as the control signal. In some embodiments of the present application, the control signal is obtained by multiplying the first code by the coefficient. Here, the first code L is a code that represents the delay tCCDL between the adjacent column address strobe signals. Because the setting of tCCDL increases according to increasing of the frequency of the external clock signal, and the change trend thereof with the frequency of the internal clock signal is opposite to the change trend of the period of the internal clock signal with the frequency of the internal clock signal, so that the control signal generated on the basis of tCCDL may effectively compensate the change of the pulse width of the target signal with the frequency of the internal clock signal.

Here, the coefficient N is an amplification coefficient of the first code L. In practical applications, the corresponding coefficient N may be selected according to the actual pulse width of the target signal. Here, the number of stages of the counter is a target value N×L represented by the control signal. In some embodiments of the present application, the target value represented by the control signal increases with increasing of the frequency of the external clock signal.

In some embodiment of the present application, the operation that when the flag signal changes from the first level to the second level, the target signal is changed from the third level to the fourth level, and after the target signal maintains the fourth level for the target time length, the target signal is changed from the fourth level to the third level, includes the following operation. While the flag signal changes from the first level to the second level, the internal clock signal is counted using a counter, and when the count value reaches the target value represented by the control signal, the counter controls the target signal to change from the fourth level to the third level.

Here, the number of stages of the counter is the target value N×L represented by the control signal. If the period of the internal clock signal is T, the target time length (i.e., the pulse width of the target signal) is T×N×L, where, L and T have opposite change trends with changes of the frequency of the internal clock signal. Therefore, the target time length (i.e., the pulse width of the target signal) hardly changes with the change of the internal clock signal frequency, and in other words, the target time length (the pulse width of the target signal) remains stable under different frequencies of the internal clock signal.

In some embodiments of the present application, the first level is a low level, the second level is a high level, the third level is a low level, and the fourth level is a high level.

Embodiments of the present application further provide a semiconductor memory, which includes the aforementioned signal generating circuit. The semiconductor memory referred to in the present application includes, but is not limited to, a dynamic random access memory and the like. The semiconductor memory may use the signal generating circuit of the present application to adjust the pulse width of a target signal generated by the signal generating circuit, so that the pulse width of the target signal thereof is not affected by the internal clock signal frequency and stabilized within a certain range.

In some embodiments of the present application, the memory of the dynamic random access memory (DRAM) chip complies with the specification of DDR4 memory.

The methods disclosed in the method embodiments provided in the present application may be combined arbitrarily without conflicting to obtain a new method embodiment.

The features disclosed in the device embodiments provided in the present application may be combined arbitrarily without conflicting to obtain a new device embodiment.

The above are only specific embodiments of the present application, and the protection scope of the present application is not limited thereto. Any persons skilled in the art may easily think of changes or replacements within the technical scope disclosed in the present application, and they should be covered within the protection scope of the present application. Therefore, the protection scope of the present application should be subject to the protection scope of the claims.

What is claimed is:

1. A signal generating circuit, comprising:
   a clock circuit, configured to receive an external clock signal to generate an internal clock signal;
   a controlling circuit, configured to generate a control signal according to a frequency of the external clock signal; and
   a generating circuit, connected with the clock circuit and the controlling circuit respectively, and configured to receive the internal clock signal, the control signal and a flag signal to generate a target signal; wherein when the flag signal changes from a first level to a second level, the target signal is changed from a third level to a fourth level, and after the target signal maintains the fourth level for a target time length, the target signal is changed from the fourth level to the third level;
   wherein the generating circuit is further configured to determine the target time length according to the internal clock signal and the control signal.

2. The signal generating circuit of claim 1, wherein the first level is a low level, the second level is a high level, the third level is a low level, and the fourth level is a high level.

3. The signal generating circuit of claim 1, wherein the generating circuit comprises a counter; and wherein when the flag signal changes from the first level to the second level, the counter starts to count the internal clock signal, and after a count value of the counter reaches a target value represented by the control signal, the counter controls the target signal to change from the fourth level to the third level.

4. The signal generating circuit of claim 1, wherein the frequency of the external clock signal does not change with variations in temperature and process.

5. The signal generating circuit of claim 1, wherein the flag signal is a check flag signal, and wherein the check flag signal is used to represent a parity check error or a redundancy check error.

6. The signal generating circuit of claim 1, wherein the clock circuit is specifically configured to shield the external clock signal based on the flag signal to generate the internal clock signal.

7. The signal generating circuit of claim 6, wherein the clock circuit comprises a logic AND gate; and
   wherein the logic AND gate is configured to receive the flag signal and the external clock signal to generate the internal clock signal.

8. The signal generating circuit of claim 1, wherein
   the target value represented by the control signal increases with increasing of the frequency of the external clock signal.

9. The signal generating circuit of claim 1, wherein the controlling circuit comprises a mode register and a calculator; wherein
   the mode register is configured to store a delay tCCD between adjacent column address strobe signals, and output a first code to represent the delay tCCD between the adjacent column address strobe signals; and
   the calculator is configured to receive the first code, and multiply the first code by a coefficient to output as the control signal.

10. A semiconductor memory, comprising the signal generating circuit of claim 1.

11. The semiconductor memory of claim 10, wherein the semiconductor memory is a Dynamic Random Access Memory (DRAM) chip, and a memory of the DRAM chip complies with specifications of DDR4.

12. A signal generating method, comprising:
    receiving, by a clock circuit, an external clock signal to generate an internal clock signal, and outputting the internal clock signal to a generating circuit;
    generating, by a controlling circuit, a control signal according to a frequency of the external clock signal, and outputting the control signal to the generating circuit; and
    receiving, by the generating circuit, the internal clock signal, the control signal and a flag signal to generate a target signal; when the flag signal changes from a first level to a second level, controlling the target signal to change from a third level to a fourth level, and after the target signal maintains the fourth level for a target time length, controlling the target signal to change from the fourth level to the third level; wherein the target time length is determined by the generating circuit according to the internal clock signal and the control signal.

13. The signal generating method of claim 12, wherein the first level is a low level, the second level is a high level, the third level is a low level, and the fourth level is a high level.

14. The signal generating method of claim 12, wherein the when the flag signal changes from the first level to the second level, controlling the target signal to change from the third level to the fourth level, and after the target signal maintains the fourth level for the target time length, controlling the target signal to change from the fourth level to the third level, comprises:
    when the flag signal changes from the first level to the second level, controlling, by a counter comprised in the generating circuit, the internal clock signal, and after a count value of the counter reaches a target value represented by the control signal, controlling, by the counter, the target signal to change from the fourth level to the third level.

15. The signal generating method of claim 12, wherein the frequency of the external clock signal does not change with variation of temperature and process.

16. The signal generating method of claim 12, wherein the flag signal is a check flag signal, and wherein the check flag signal is used to represent a parity check error or a redundancy check error.

17. The signal generating method of claim 12, wherein receiving, by the clock circuit, the external clock signal to generate the internal clock signal comprises:
    shielding, by the clock circuit, the external clock signal based on the flag signal to generate the internal clock signal.

18. The signal generating method of claim 17, wherein receiving, by the clock circuit, the external clock signal to generate the internal clock signal comprises:
    receiving, by a logic AND gate comprised in the clock circuit, the flag signal and the external clock signal to generate the internal clock signal.

19. The signal generating method of claim 12, wherein
    the target value represented by the control signal increases with increasing of the frequency of the external clock signal.

20. The signal generating method of claim 12, wherein generating, by the controlling circuit, the control signal according to the frequency of the external clock signal comprises:
    outputting, by a mode register comprised in the controlling circuit, a first code to represent a delay tCCD between adjacent column address strobe signals, wherein the mode register stores the delay tCCD; and receiving, by a calculator comprised in the controlling circuit, the first code, and multiplying the first code by a coefficient to output as the control signal.

\* \* \* \* \*